United States Patent
Ishikawa

(10) Patent No.: US 9,200,773 B2
(45) Date of Patent: Dec. 1, 2015

(54) INCLINATION SENSOR DEVICE AND VEHICLE LAMP SYSTEM USING THE SAME

(71) Applicant: Koito Manufacturing Co., Ltd., Tokyo (JP)

(72) Inventor: Masaaki Ishikawa, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 100 days.

(21) Appl. No.: 13/911,794

(22) Filed: Jun. 6, 2013

(65) Prior Publication Data

US 2013/0329441 A1    Dec. 12, 2013

(30) Foreign Application Priority Data

Jun. 7, 2012   (JP) ................. 2012-129521

(51) Int. Cl.
| | |
|---|---|
| F21V 21/28 | (2006.01) |
| F21S 8/10 | (2006.01) |
| H05K 5/00 | (2006.01) |
| G01C 9/06 | (2006.01) |
| B60Q 1/115 | (2006.01) |

(52) U.S. Cl.
CPC ............ *F21S 48/1742* (2013.01); *B60Q 1/115* (2013.01); *G01C 9/06* (2013.01); *H05K 5/0039* (2013.01); *H05K 5/0078* (2013.01)
USPC ............................ 362/464; 362/467; 362/460

(58) Field of Classification Search
CPC ..... B60Q 1/10; B60Q 2300/132; B60Q 1/115
USPC ........................... 362/464, 467, 460, 465, 466
See application file for complete search history.

(56) References Cited

U.S. PATENT DOCUMENTS

| | | | |
|---|---|---|---|
| 7,036,964 B2 * | 5/2006 | Takii et al. ..................... | 362/465 |
| 7,057,504 B2 * | 6/2006 | Hayami ....................... | 340/458 |
| 7,621,663 B2 * | 11/2009 | Tajima et al. ................. | 362/530 |
| 2007/0051001 A1 * | 3/2007 | Hasegawa et al. ......... | 33/366.24 |
| 2012/0106179 A1 * | 5/2012 | Kasaba et al. ................ | 362/465 |

FOREIGN PATENT DOCUMENTS

| | | |
|---|---|---|
| CN | 1572587 A | 2/2005 |
| CN | 101162077 A | 4/2008 |
| DE | 198 03 359 A1 | 8/1999 |
| JP | 2000-85459 A | 3/2000 |
| JP | 2012-30782 A | 2/2012 |
| JP | 2012-30783 A | 2/2012 |

OTHER PUBLICATIONS

English Translation of specification and claims of Bunz DE19803359.*

* cited by examiner

*Primary Examiner* — Evan Dzierzynski
(74) *Attorney, Agent, or Firm* — Sughrue Mion, PLLC

(57) ABSTRACT

There is provided an inclination sensor device. The inclination sensor device includes: a substrate which mounts an inclination sensor configured to calculate an inclination angle of a vehicle; a case which accommodates the substrate; a first positioning mechanism which positions the substrate relative to the case in a first direction that is substantially parallel to a first main surface of the substrate; and a second positioning mechanism which positions the substrate relative to the case in a second direction that is substantially perpendicular to the first main surface of the substrate.

9 Claims, 7 Drawing Sheets

INCLINATION SENSOR DEVICE AND VEHICLE LAMP SYSTEM USING THE SAME

CROSS-REFERENCE TO RELATED APPLICATION

This application claims priority from Japanese Patent Application No. 2012-129521, filed on Jun. 7, 2012, the entire contents of which are hereby incorporated by reference.

BACKGROUND

1. Technical Field

The present disclosure relates to an inclination sensor device and a vehicle lamp system using the inclination sensor device, and particularly to an inclination sensor device which is provided in a vehicle such as an automobile, and a vehicle lamp system which includes the inclination sensor device.

2. Related Art

In the related art, an auto-leveling control is known which changes an irradiation direction of a vehicle headlamp by automatically controlling an optical axis position of the vehicle headlamp according to an inclination angle of a vehicle. In general, in the auto-leveling control, the optical axis position of the headlamp is adjusted based on a pitch angle of the vehicle which is obtained from an output value of a vehicle height sensor. JP-A-2012-030782 and JP-A-2012-030783 describes that control devices of a vehicle lamp perform an auto-leveling control by using an inclination sensor such as an acceleration sensor.

Compared to when a vehicle height sensor is used, when an inclination sensor such as an acceleration sensor, a gyro sensor (angular velocity sensor or angular acceleration sensor) or a magnetic field sensor is used, costs of an auto-leveling system can be reduced, and weight reduction can be improved. As a result, cost reduction and weight reduction of a vehicle can be improved. On the other hand, even in the case where the inclination sensor such as an acceleration sensor is used, a demand to enhance accuracy of the auto-leveling control continuously exists.

SUMMARY OF THE INVENTION

One of aspects of the present invention is to provide a technology which enhances accuracy of an auto-leveling control of a vehicle lamp.

According to one or more aspects of the present invention, there is provided an inclination sensor device. The inclination sensor device comprises: a substrate which mounts an inclination sensor configured to calculate an inclination angle of a vehicle; a case which accommodates the substrate; a first positioning mechanism which positions the substrate relative to the case in a first direction that is substantially parallel to a first main surface of the substrate; and a second positioning mechanism which positions the substrate relative to the case in a second direction that is substantially perpendicular to the first main surface of the substrate.

According to one or more aspects of the present invention, there is provided a vehicle lamp system. The vehicle lamp system comprises: a vehicle lamp configured to adjust an optical axis; the inclination sensor device, wherein an inclination sensor is mounted in the inclination sensor device; and a control device configured to generate a vehicle inclination angle information based on an output value of the inclination sensor and to control the vehicle lamp to adjust the optical axis of the vehicle lamp based on the vehicle inclination angle information.

DETAILED DESCRIPTION

Figure 1:
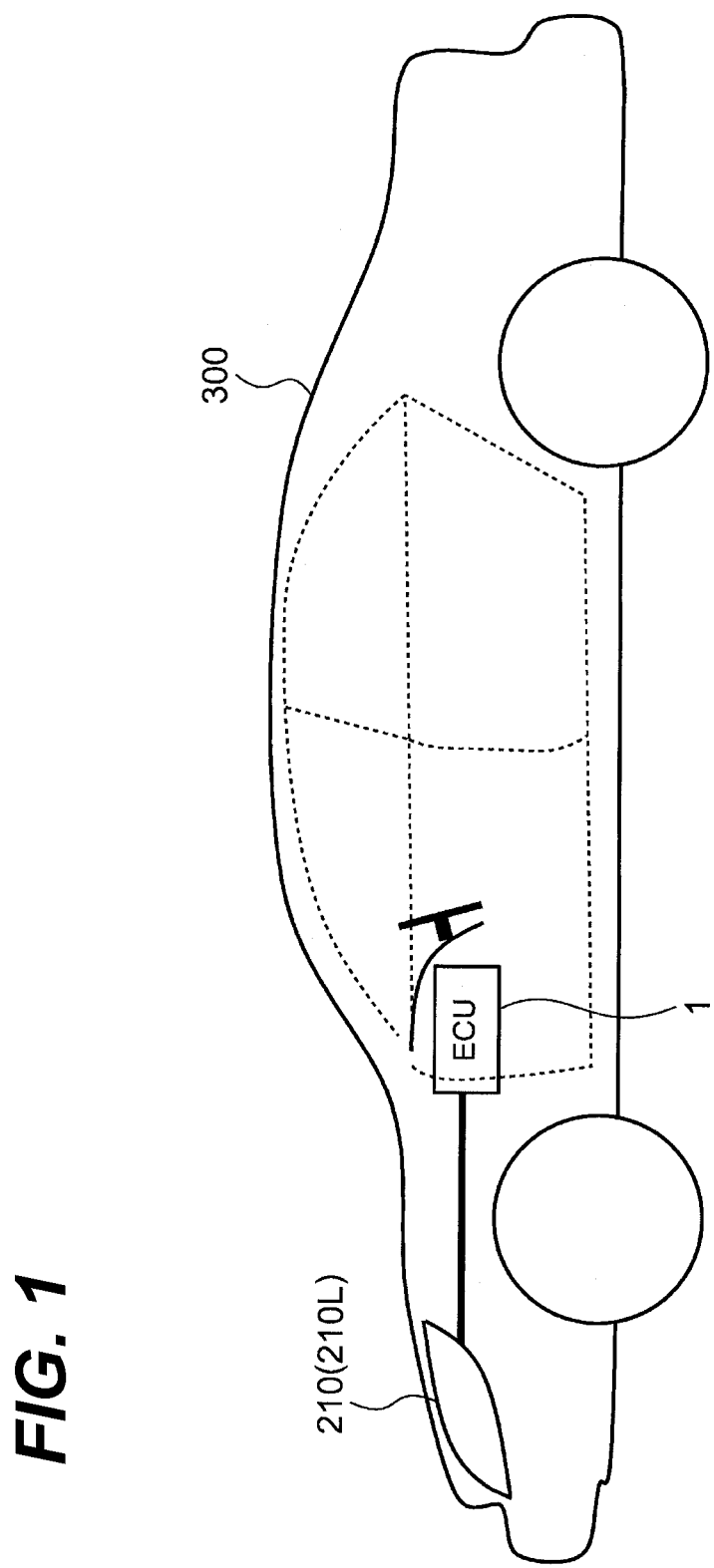
FIG. 1 is a schematic view for illustrating a mounting position of an inclination sensor device according to Embodiment 1.

Hereinafter, the present invention will be described based on preferred embodiments with reference to drawings. The same reference numerals are attached to the same or equivalent components and members shown in each drawing, and overlapped descriptions are appropriately omitted. Moreover, the embodiments do not limit the present invention but exemplify the invention, and all characteristics described in embodiments or combinations thereof are not necessarily the essentials of the invention.

(Embodiment 1)

FIG. 1 is a schematic view for illustrating a mounting position of an inclination sensor device according to Embodiment 1. The inclination sensor device is included in a leveling ECU 1, and for example, the leveling ECU 1 is installed near a dashboard of a vehicle body 300. Moreover, the installation position of the leveling ECU 1 or the inclination sensor is not particularly limited, and for example, may be provided in a headlamp unit 210. For example, if the leveling ECU 1 receives an instruction with respect to operation of an auto-leveling control from a light switch or the like which is mounted on a vehicle, the leveling ECU 1 starts the auto-leveling control.

In the auto-leveling control, the leveling ECU 1 generates information of an inclination angle in a pitch direction of the vehicle using an output value of the inclination sensor. Moreover, the leveling ECU 1 controls a leveling actuator 226 (refer to FIG. 2) using the obtained information, and adjusts an optical axis of a lamp unit 10 (refer to FIG. 2), which is a vehicle lamp mounted on the headlamp unit 210, to an angle corresponding to a vehicle attitude. In this way, the auto-leveling control, which performs the leveling adjustment of the lamp unit in real time based on the vehicle attitude, is carried out, and thus, an arrival distance of front irradiation can be optimally adjusted even when the vehicle attitude is changed.

Figure 2:
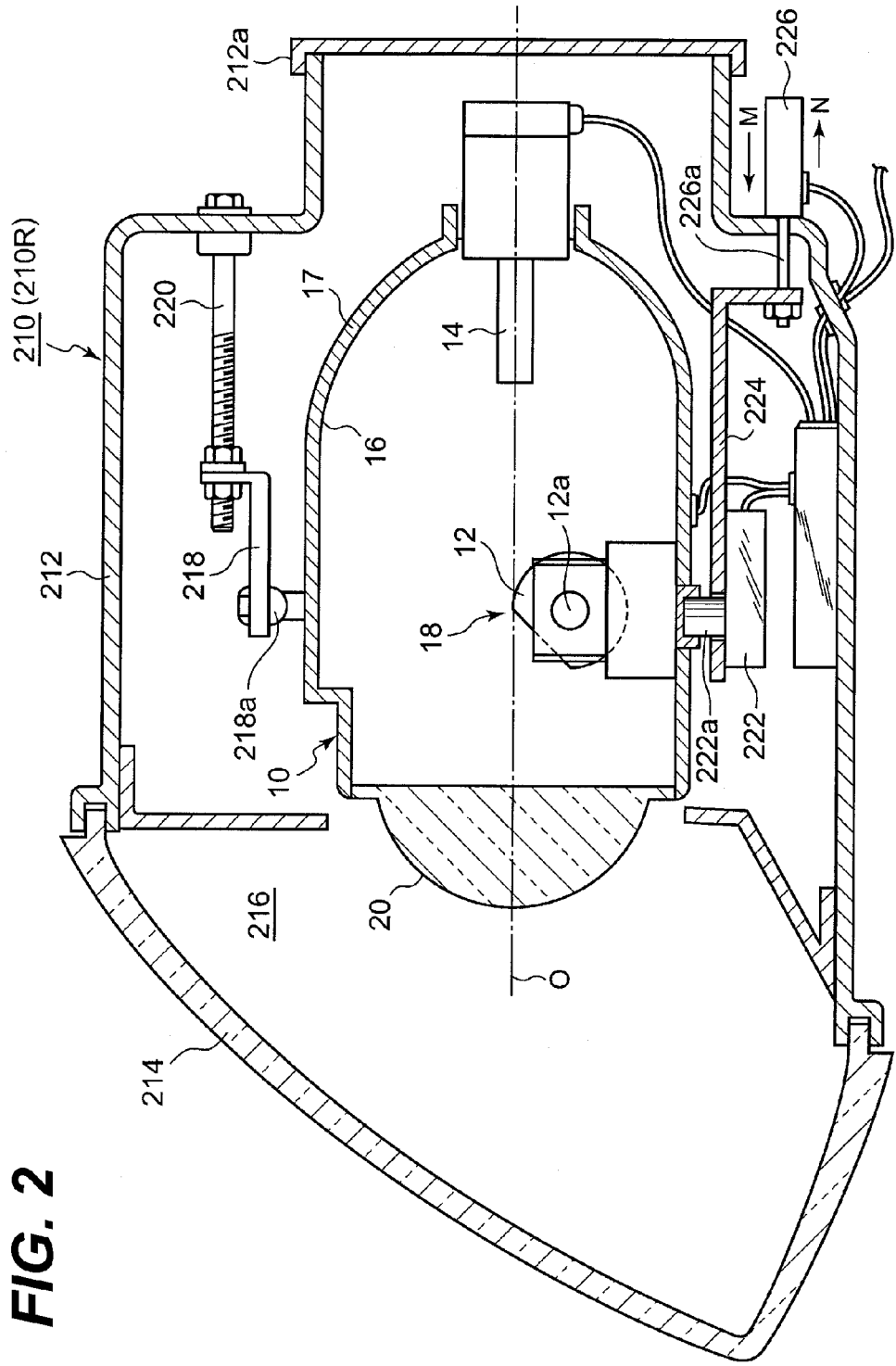
FIG. 2 is a schematic vertical cross-sectional view of a headlamp unit which includes a vehicle lamp.

FIG. 2 is a schematic vertical cross-sectional view of the headlamp unit which includes the vehicle lamp. The headlamp unit 210 is configured so that a pair of headlamp units formed symmetrically in the left and right is disposed one by one on the left and right in a vehicle width direction of the vehicle. Since the headlamp units disposed in the left and right have substantially the same configuration, hereinafter, a structure of a right side headlamp unit 210R is described, and descriptions of a left side headlamp unit 210L are appropriately omitted herein. The headlamp unit 210R includes a lamp body 212 which includes an opening portion in a vehicle front side, and a translucent cover 214 which covers the opening portion. The lamp body 212 includes a detachable cover 212a in a vehicle rear side. A lamp chamber 216 is formed by the lamp body 212 and the translucent cover 214. The lamp unit 10 is accommodated in the lamp chamber 216.

A lamp bracket 218, which includes a pivot mechanism 218a that becomes a swivel center in vertical and lateral directions of the lamp unit 10, is formed in the lamp unit 10. The lamp bracket 218 is screwed to an aiming adjustment screw 220 which is supported by the lamp body 212. A rotating shaft 222a of a swivel actuator 222 is fixed to a lower surface of the lamp unit 10. The swivel actuator 222 is fixed to a unit bracket 224. The leveling actuator 226 is connected to the unit bracket 224. For example, the leveling actuator 226 is configured of a motor, which extends and contracts a rod 226a in arrow directions M and N, or the like. The rod 226a is expanded and contracted in arrow directions M and N, and thus, the lamp unit 10 has a backward inclined attitude and a forward inclined attitude, and a leveling adjustment is performed in which a pitch angle of an optical axis O faces downward or upward.

The lamp unit 10 includes a shade mechanism 18 which includes a rotary shade 12, a bulb 14, a lamp housing 17 which supports a reflector 16 on an inner wall, and a projection lens 20. As the bulb 14, an incandescent bulb, a halogen lamp, a discharge bulb, an LED, or the like may be used. At least a portion of the reflector 16 has a shape of an elliptic spherical surface, and reflects light which is radiated from the bulb 14. A portion of the light from the bulb 14 and the light reflected by the reflector 16 is led to the projection lens 20 via the rotary shade 12. The rotary shade 12 is a cylindrical member which can rotate about a rotating shaft 12a, and includes a cutout portion and a plurality of shade plates (not shown). The cutout portion or the shade plate moves on an optical axis O, and thus, a predetermined light distribution pattern is formed. The projection lens 20 is configured of a plano-convex aspherical lens, and projects an image of a light source, which is formed on a backward focal plane, on a virtual vertical screen in front of the lamp as a reverted image.

Figure 3:
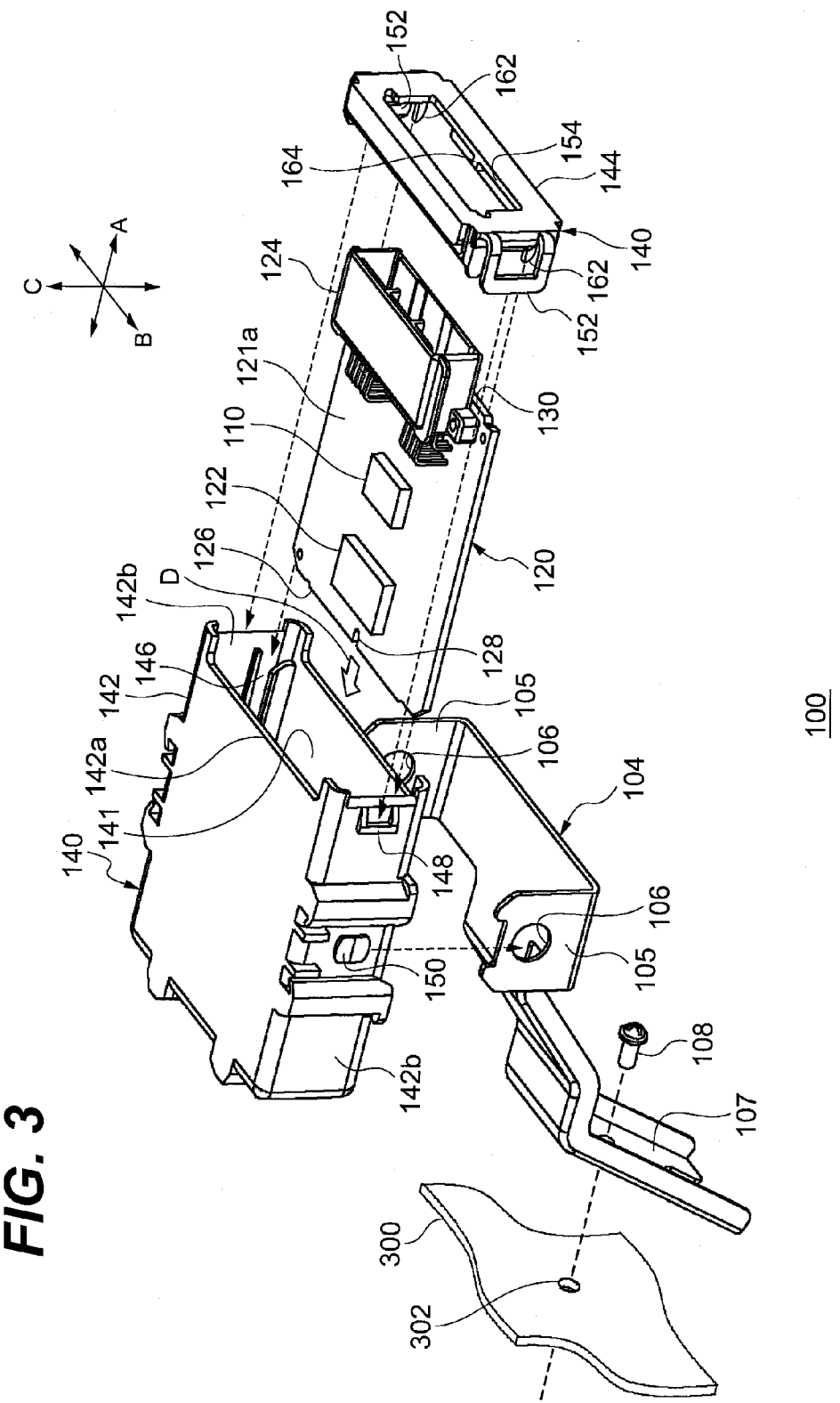
FIG. 3 is a schematic exploded perspective view of a sensor mounting structure which mounts the inclination sensor device and an inclination sensor according to Embodiment 1 to a vehicle body.

Subsequently, an inclination sensor device according to Embodiment 1 will be described in detail. FIG. 3 is a schematic exploded perspective view of a sensor mounting structure which mounts the inclination sensor device and the inclination sensor according to Embodiment 1 to the vehicle body. A sensor mounting structure 100 is a structure for mounting the inclination sensor to the vehicle body 300, and includes an inclination sensor device 102 and a mounting portion 104 which mounts the inclination sensor device 102 to a predetermined position of the vehicle body 300.

The inclination sensor device 102 includes a substrate 120 which mounts an inclination sensor 110 used for calculation of an inclination angle of a vehicle, and a case 140 which accommodates the substrate 120. The substrate 120 includes a predetermined wiring pattern on a first main surface 121a, and mounts: an inclination sensor 110; a CPU 122 which is a control device; a ROM which stores various control programs; a RAM which is used as a work area for storing data or performing the programs; an input interface (input I/F) for observation of input voltage to the substrate 120, input signals from various switches or communication; an output interface (output I/F) for output of control signals to the leveling actuator 226 or communication; a memory. The CPU 122 generates information of the inclination angle of the vehicle by using an output value of the inclination sensor 110, and controls an optical-axis adjustment of the lamp unit 10 by using the information. Therefore, the inclination sensor device 102 configures a portion of the leveling ECU 1. In the present embodiment, the inclination sensor 110 is an acceleration sensor. Moreover, a connector 124 for inputting vehicle speed signals, light switch signals, or the like from the vehicle side or outputting the generated information to the outside is mounted on the substrate 120. In the present embodiment, the substrate 120 is formed in a rectangle shape in a plan view, and the connector 124 is provided on one side of the substrate.

The case 140 has a flat rectangular parallelepiped shape, and includes a main body portion 142 and a cover portion 144. The main body portion 142 is a container-like member which includes an accommodation space 141 of the substrate 120. The main body portion 142 includes an opening 142a on a surface corresponding to a side wall of the case 140. In addition, the main body portion 142 includes a substrate guide 146 which intersects an extension direction of the opening 142a and extends to be parallel to the main surface of the case 140 on inner side surfaces of two side walls 142b opposite to each other. A lance engaging convex portion 148 to the cover portion 144 is provided in an area near the opening 142a on the outer side surfaces of two side walls 142b. Moreover, an engaging convex portion 150 to the mounting portion 104 is provided in the center portion of the outer side surfaces of two side walls 142b. The cover portion 144 is a member which closes the opening 142a of the main body portion 142, and configures the side wall of the case 140. A lance engaging hook 152 is provided on a side wall of the cover portion 144 which is connected to the side wall 142b of the main body portion 142. The hook 152 includes an opening portion having a shape matching the convex portion 148. In addition, the cover portion 144 includes an opening portion 154 for making the connector 124 of the substrate 120 accommodated in the main body portion 142 face the outside.

Moreover, the inclination sensor device 102 includes a first positioning mechanism which positions the substrate 120 relative to the case 140 in a first direction (directions shown by arrows A and B in FIG. 3) approximately parallel to the main surface of the substrate 120, and a second positioning mechanism which positions the substrate 120 relative to the case 140 in a second direction (a direction shown by an arrow C in FIG. 3) approximately perpendicular to the main surface of the substrate 120. The first positioning mechanism and the second position structure will be described in detail hereinafter.

The mounting portion 104 is an approximately flat plate-like member, and two flat plate-like arm portions 105 are provided in one end side of the mounting portion. The two arm portions 105 are disposed so that the main surfaces are opposite to each other with an interval which is wider than an interval of two side walls 142b of the case 140 and is narrower than a distance between top portions of two convex portions 150. A circular opening portion 106 is provided in each of two arm portions 105. A connecting portion 107 which is connected to the vehicle body 300 is provided in the other end side of the mounting portion 104. A through hole (not shown), through which a fastening member 108 such as a screw is inserted, is provided at a predetermined position of the connecting portion 107.

The substrate 120 is inserted from the end opposite to the connector 124 into the accommodation space 141 of the main body portion 142 via the opening 142a, and is inserted along the substrate guide 146. In the present embodiment, the substrate 120 is accommodated in the main body portion 142 so that the inclination sensor 110 or the CPU 122 is disposed on an upper side (upper side in FIG. 3) of the substrate 120. After the substrate 120 is accommodated in the main body portion 142, the cover portion 144 is loosely connected to the opening 142a. The cover portion 144 is fitted to the opening 142a of the main body portion 142 so that the connector 124 is inserted into the opening portion 154, and is fixed to the main body portion 142 by a lance engagement between the convex portion 148 and the hook 152. The connector 124 is exposed to the outside of the case from the opening portion 154. A harness for connecting the substrate 120 and external equipment is connected to the connector 124.

The case 140 is connected to the mounting portion 104 in a state where the convex portion 150 of the side wall 142b is fitted to the opening portion 106b of the arm portion 105 and the case is held by two arm portions 105. The mounting portion 104 is positioned so that the through hole of the connecting portion 107 and a connecting hole 302 of the vehicle body 300 are overlapped with each other, and is fixed to the vehicle body 300 by inserting the fastening member 108 into the through hole and the connecting hole 302.

Figure 4A:
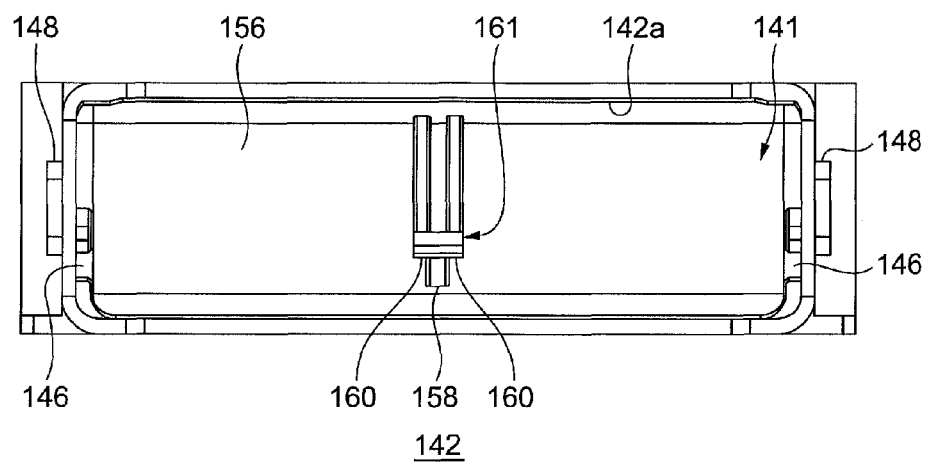
FIG. 4A is a schematic side view when a case body portion is viewed from an opening side in the inclination sensor device according to Embodiment 1.
Figure 4B:
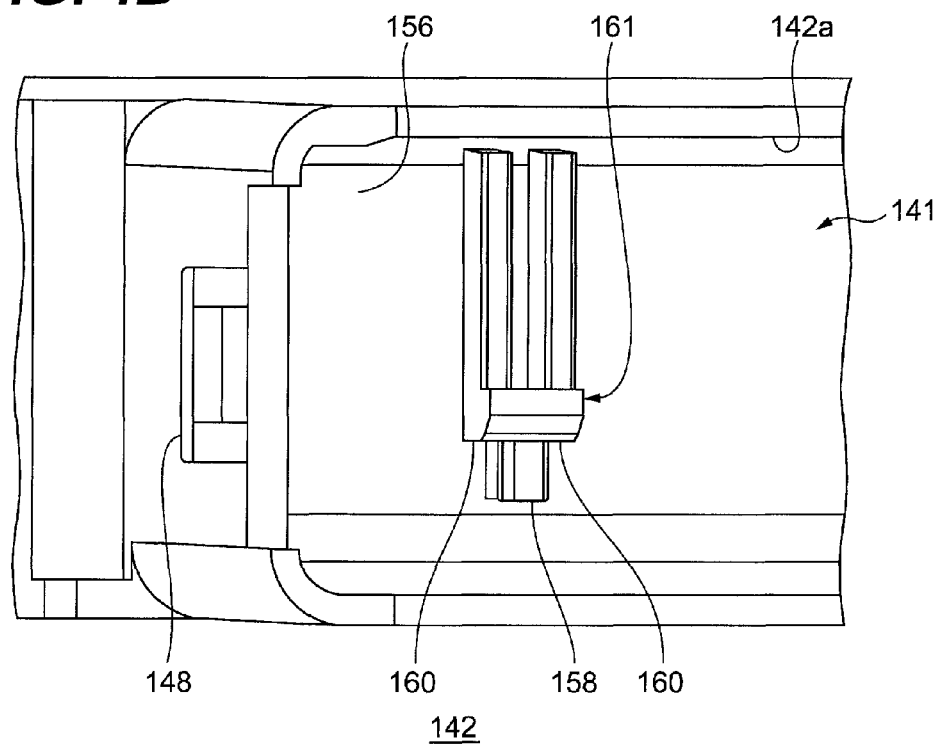
FIG. 4B is a view showing an outline of a positioning mechanism which is provided on an inner wall of the case body portion.
Figure 5A:
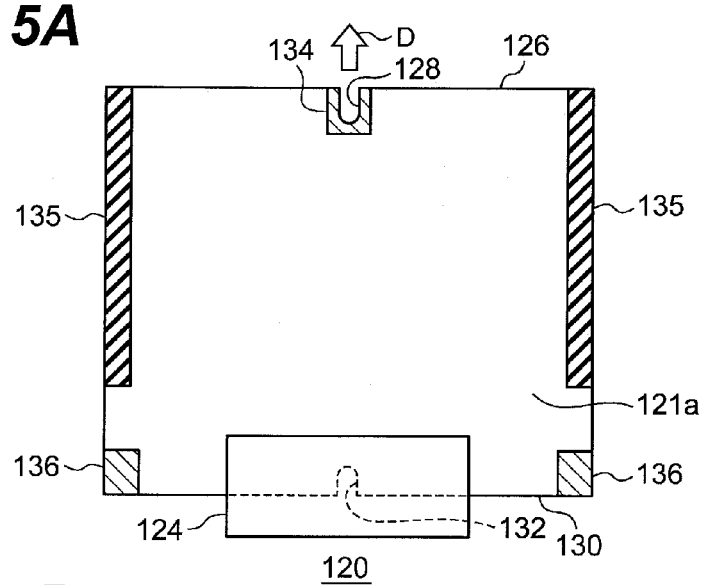
FIG. 5A is a schematic plan view of a substrate.
Figure 5B:
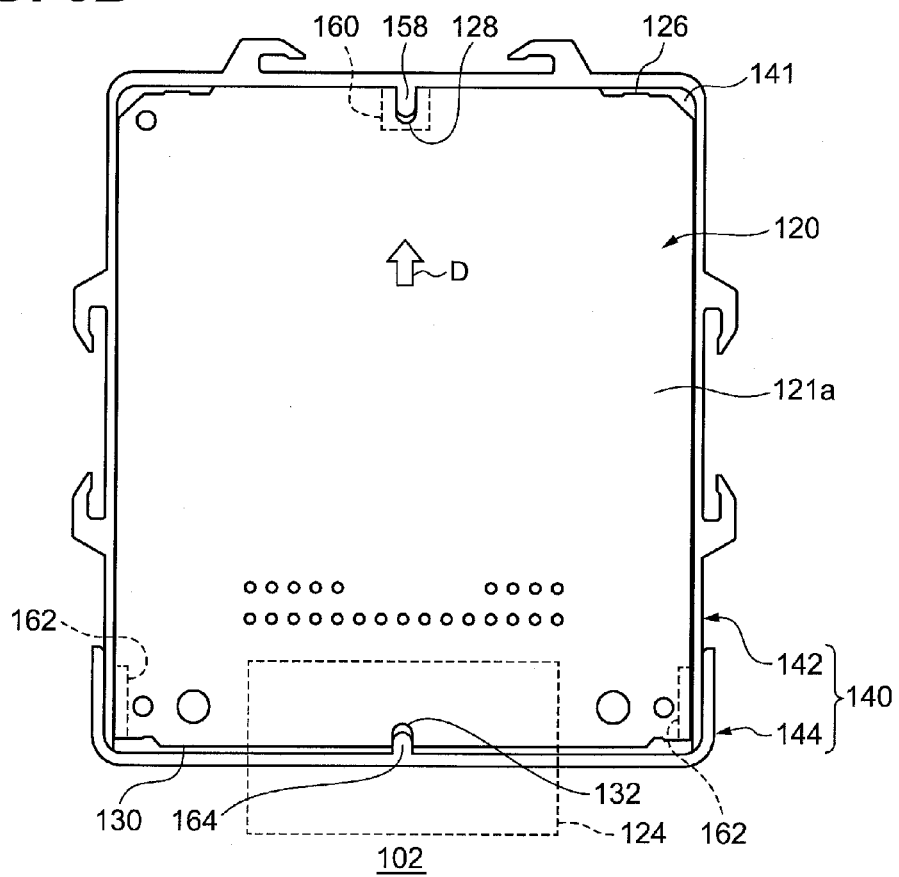
FIG. 5B is a perspective plan view showing a schematic structure of an inner portion of the inclination sensor device.

Hereinafter, the first positioning mechanism and the second positioning mechanism of the inclination sensor device 102 according to the present embodiment will be described. FIG. 4A is a schematic side view when the case body portion is viewed from the opening side in the inclination sensor device according to Embodiment 1. FIG. 4B is a view showing an outline of the positioning mechanism which is provided on the inner wall of the case body portion. FIG. 5A is a schematic plan view of the substrate. FIG. 5B is a plan perspective view showing a schematic structure of an inner portion of the inclination sensor device. In FIGS. 5A and 5B, illustrations of the inclination sensor 110, the CPU 122, or the like mounted on the substrate 120 are omitted. Moreover, in FIG. 5B, a substrate receiving portion 160 and a substrate receiving portion 162, which abut the upper surface of the substrate 120, are indicated by dashed lines. Hereinafter, for convenience, a direction, which is parallel to the main surface of the case 140 and is perpendicular to two side walls 142b, is referred to as a lateral direction, a direction, which is parallel to the main surface of the case 140 and the side wall 142b, is referred to as a longitudinal direction, and a direction which is perpendicular to the main surface of the case 140 is referred to as a vertical direction.

As shown in FIGS. 4A and 4B, in the case 140, a protrusion 158 is provided on a first inner wall 156 of the main body portion 142 opposite to the cover portion 144 while interposing the substrate 120. The first inner wall 156 is an inner side surface of a side wall approximately perpendicular to the side wall 142b. The main body portion 142 and the protrusion 158 are integrally molded by a resin material such as polybutylene terephthalate (PBT) which is softer than the substrate 120 configured of a glass epoxy substrate or the like. The protrusion 158 protrudes so as to have a side surface parallel to the side wall 142b from the first inner wall 156 toward the cover portion 144 or the opening 142a. In addition, the protrusion 158 extends in the vertical direction of the first inner wall 156. The protrusion 158 is provided at an approximately center of the first inner wall 156 in the position in the lateral direction, and is provided at approximately the same position as two substrate guides 146 in the position in the vertical direction.

The substrate receiving portion 160, which is opposite to the main surface of the lower side of the main body portion 142, is provided on the upper end side of the protrusion 158. In the present embodiment, a protrusion 161 extending in the lateral direction is provided on the first inner wall 156, and the protrusion 161 contacts the upper end of the protrusion 158. The protrusion 161 further protrudes to the cover portion 144 side than the protrusion 158, and extends so as to be longer in the lateral direction than the protrusion 158. The protrusion 161 includes a plane opposite to the main surface of the lower side of the main body portion 142, and the plane configures the substrate receiving portion 160. Moreover, as shown in FIG. 3, two substrate receiving portions 162, which protrude to the accommodation space 141 and are disposed with a predetermined interval in the lateral direction, are provided on the cover portion 144. Two substrate receiving portions 162 are provided in the further inner side in the lateral direction than the two side walls 142, and are disposed in the accommodation space 141 in a state where the cover portion 144 is fitted to the main body portion 142. Moreover, the substrate receiving portion 162 is disposed so that the upper end of the receiving portion 162 and the height (distance from the main surface of the case 140) of the lower end of the substrate guide 146 approximately coincide with each other. In addition, in the cover portion 144, a protrusion 164, which protrudes toward the first inner wall 156 of the main body portion 142, is provided at approximately the center in the lateral direction of the surface facing the accommodation space 141 side.

As shown in FIG. 5A, in the substrate 120, a protrusion receiving portion 128 is provided on a first side surface 126 opposite to the first inner wall 156 of the main body portion 142. In the present embodiment, the protrusion receiving portion 128 is configured of a groove in which the substrate 120 is cut into so as to be approximately parallel to an insertion direction D of the substrate 120 to the main body portion 142 from the first side surface 126. The protrusion receiving portion 128 is disposed at approximately the center in the lateral direction of the first side surface 126, and extends from the first main surface 121a of the substrate 120 to a second main surface 121b (refer to FIG. 6B) of the opposite side. Moreover, in the substrate 120, a protrusion receiving portion 132 is provided on a second side surface 130 opposite to the cover portion 144. In the present embodiment, the protrusion receiving portion 132 is configured of a groove in which the substrate 120 is cut into so as to be approximately parallel to the insertion direction D from the second side surface 130. The protrusion receiving portion 132 is disposed at an approximately center in the lateral direction of the second side surface 130, and extends from the first main surface 121a of the substrate 120 to a second main surface 121b.

A mutual dimension relationship between the protrusion receiving portion 128 of the substrate 120 and the protrusion 158 of the main body portion 142 is determined so that a width dimension (the length in the direction approximately perpendicular to the protrusion direction of the protrusion 158) of the protrusion 158 is slightly larger than a width dimension of the protrusion receiving portion 128. Moreover, the mutual dimension relationship is determined so that a protrusion length of the protrusion 158 is smaller than a depth of the groove of the protrusion receiving portion 128. On the other hand, a mutual dimension relationship between the protrusion receiving portion 132 of the substrate 120 and the protrusion 164 of the cover portion 144 is determined so that a width dimension of the protrusion 164 is approximately the same as or slightly smaller than a width dimension of the protrusion receiving portion 132. In addition, the mutual dimension relationship is determined so that a protrusion length of the protrusion 164 is smaller than a depth of the groove of the protrusion receiving portion 132. The dimension relationship between the protrusion 158 and the protrusion receiving portion 128 can be appropriately designed so that press-fitting of the protrusion into the protrusion receiving portion described below is performed.

In the first main surface 121a of the upper side of the substrate 120, an area 134 around the protrusion receiving portion 128 is an area in which the substrate receiving portion 160 abuts the substrate in a state where the substrate 120 is accommodated in the case 140. Areas 135, which extend from the first side surface 126 toward a second side surface 130 on right and left ends of the substrate 120, are areas in which the substrate engages with the substrate guide 146 in the state where the substrate 120 is accommodated in the case 140. In the first main surface 121a of the upper side of the substrate 120, areas 136, which are positioned on right and left corners of the second side surface 130 side, are areas in which the substrate receiving portion 162 abuts the substrate in the state where the substrate 120 is accommodated in the case 140.

As shown in FIG. 5B, if the substrate 120 is inserted into the main body portion 142, the protrusion 158 of the main body portion 142 is press-fitted into the protrusion receiving portion 128 of the substrate 120. In the present embodiment, the insertion direction D of the substrate 120 to the main body portion 142 is the same as the press-fitting direction of the protrusion 158 to the protrusion receiving portion 128. Thereby, the substrate 120 is inserted into the main body portion 142 and the protrusion 158 is press-fitted to the protrusion receiving portion 128. Since the protrusion 158 is formed of a material which is softer than that of the substrate 120, when the protrusion 158 enters the protrusion receiving portion 128, the protrusion 158 is pressed by the side surfaces of the protrusion receiving portion 128 and is deformed. In this way, since the protrusion 158 is press-fitted to the protrusion receiving portion 128, positioning in a first direction of the substrate 120 relative to the case 140 is mainly accomplished.

Moreover, if the cover portion 144 is fitted to the main body portion 142, the protrusion 164 of the cover portion 144 is inserted into the protrusion receiving portion 132 of the substrate 120. In the present embodiment, since the attachment direction of the cover portion 144 to the main body portion 142 is the same as the insertion direction of the protrusion 164 to the protrusion receiving portion 132, the cover portion 144 is fitted to the main body portion 142 and the protrusion 164 is inserted into the protrusion receiving portion 132. Since the first side surface 126 side of the substrate 120 is positioned by the press-fitting of the protrusion 158 to the protrusion receiving portion 128 and the second side surface 130 side opposite to the first side surface 126 is positioned by the inserting of the protrusion 164 to the protrusion receiving portion 132, the positioning in the first direction of the substrate 120 relative to the case 140 can be more certainly accomplished.

In addition, if the substrate 120 is inserted into the main body portion 142, the areas 135 of the substrate 120 engage with the substrate guide 146. Moreover, the substrate 120 enters the lower side of the protrusion 161 (refer to FIG. 4), and the area 134 of the first main surface 121a abuts the substrate receiving portion 160. In addition, if the cover portion 144 is fitted to the main body portion 142, the substrate 120 enters the lower side of the substrate receiving portion 162, and the substrate receiving portion 162 abuts the areas 136 of the first main surface 121a. Thereby, positioning in a second direction of the substrate 120 relative to the case 140 is accomplished. In addition, also by the press-fitting of the protrusion 158 to the protrusion receiving portion 128 and/or the insertion of the protrusion 164 to the protrusion receiving portion 132, the positioning of the substrate and the case in the second direction is accomplished to a certain degree.

Therefore, in the inclination sensor device 102 of the present embodiment, the above-described first positioning mechanism has a structure which is configured of the protrusions 158 and 164 provided in the case 140 and the protrusion receiving portions 128 and 132 provided in the substrate 120, and in which the protrusion 158 is press-fitted to the protrusion receiving portion 128, the protrusion 164 is inserted into the protrusion receiving portion 132, and the substrate 120 is positioned relative to the case 140. Moreover, the above-described second positioning mechanism is configured of the substrate guide 146, the substrate receiving portions 160 and 162, and upper and lower main surfaces of the substrate 120.

As described above, the inclination sensor device 102 according to the present embodiment includes the substrate 120 which mounts the inclination sensor 110, the case 140 which accommodates the substrate 120, the first positioning mechanism which positions the substrate 120 relative to the case 140 in the first direction approximately parallel to the main surface of the substrate 120, and the second positioning mechanism which positions the substrate 120 relative to the case 140 in the second direction approximately perpendicular to the main surface of the substrate 120. Thereby, since the positioning accuracy of the substrate 120 relative to the case 140 can be increased, the inclination sensor 110 can be accurately mounted on the vehicle. For this reason, the auto-leveling control of the lamp unit 10 which is a vehicle lamp can be performed with high accuracy.

Moreover, the first positioning mechanism has a structure which includes protrusions 158 and 164 provided in the case 140 and protrusion receiving portions 128 and 132 provided in the substrate 120, and in which the protrusion 158 is press-fitted to the protrusion receiving portion 128, the protrusion 164 is inserted into the protrusion receiving portion 132, and thus the substrate 120 is positioned relative to the case 140. Thereby, it is possible to position the substrate 120 relative to the case 140 by a simpler structure without increasing the number of parts. Moreover, the insertion direction D of the substrate 120 to the main body portion 142 and the press-fitting direction of the protrusion 158 to the protrusion receiving portion 128 are set so as to be the same as each other. Thereby, the substrate 120 is inserted into the main body portion 142 and the protrusion 158 can be press-fitted to the protrusion receiving portion 128. Therefore, assembly of the inclination sensor device 102 can be simplified. In addition, the protrusion 164 is provided in the cover portion 144, and the protrusion receiving portion 132 is provided on the second side surface 130 of the substrate 120 opposite to the cover portion 144. Thereby, the positioning in the first direction of the substrate 120 relative to the case 140 can be performed with higher accuracy.

Moreover, in the present embodiment, the protrusions 158 and 164 are provided in the case 140 and the protrusion receiving portions 128 and 132 are provided in the substrate 120. However, the protrusions may be provided in the substrate 120, and the protrusion receiving portions may be provided in the case 140. Moreover, similar to the first positioning mechanism, the second positioning mechanism may also have a structure which includes the protrusion provided in one of the substrate 120 and the case 140 and the protrusion receiving portion provided in the other, and in which the protrusion is press-fitted to the protrusion receiving portion and the substrate 120 is positioned relative to the case 140. Moreover, only the second positioning mechanism may have the structure in which the substrate 120 is positioned relative to the case 140 by the press-fitting of the protrusion and the protrusion receiving portion.

(Embodiment 2)

The inclination sensor device 102 according to Embodiment 2 is the same as that of Embodiment 1 except that the first positioning mechanism and the second positioning mechanism are different from those of Embodiment 1. Hereinafter, with respect to the inclination sensor device 102 according to Embodiment 2, configurations different from those of Embodiment 1 will be mainly described.

Figure 6A:
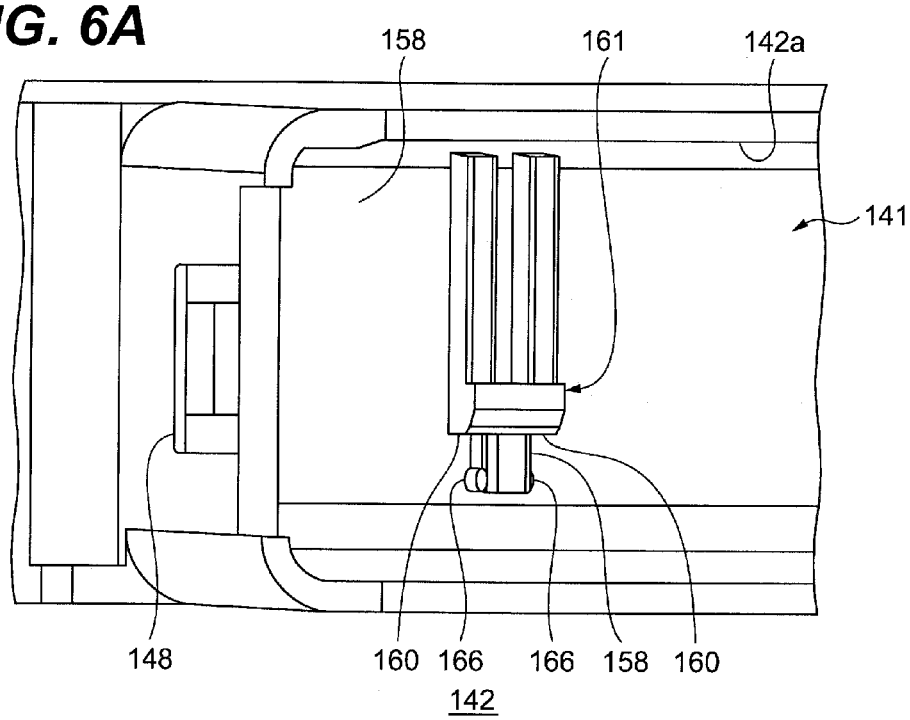
FIG. 6A is a view showing an outline of a positioning mechanism which is provided on an inner wall of a case body portion in an inclination sensor device according to Embodiment 2.
Figure 6B:
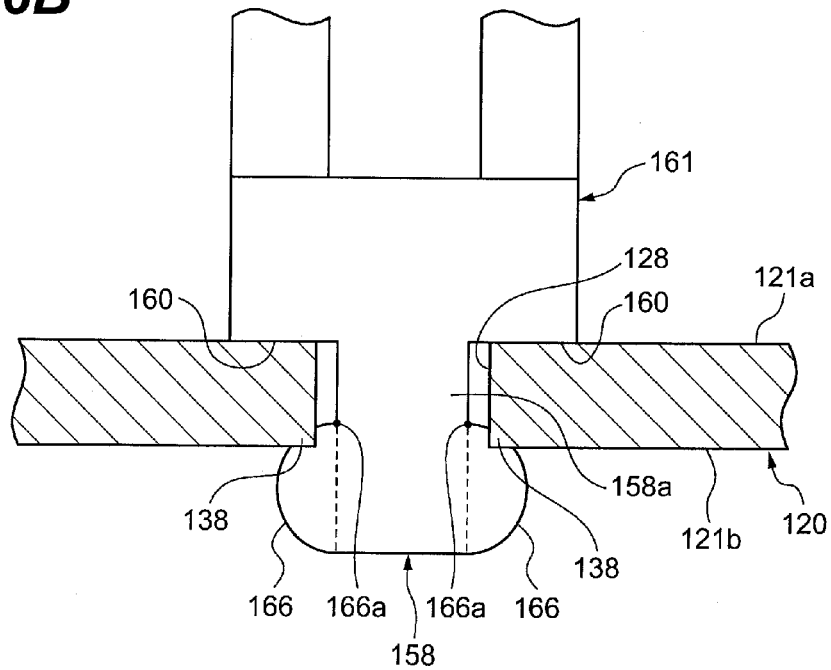
FIG. 6B is a schematic view for illustrating the positioning mechanism in the inclination sensor device according to Embodiment 2.

FIG. 6A is a view showing an outline of a positioning mechanism which is provided on an inner wall of a case body portion in the inclination sensor device according to Embodiment 2. FIG. 6B is a schematic view for illustrating the positioning mechanism in the inclination sensor device according to Embodiment 2. As shown in FIG. 6A, the protrusion 158, which is provided on the first inner wall 156 of the main body portion 142, includes two press-fit margin portions 166 in the lower end of the protrusion. The two press-fit margin portions 166 are configured of a convex portion which protrudes from the side surface of the protrusion 158 opposite to one side wall 142b to the one side wall 142b side, and a convex portion which protrudes from the side surface of the protrusion 158 opposite to the other side wall 142b to the other side wall 142b side. In the present embodiment, the pressure-fit margin portion 166 has a semicircular shape when it is viewed from a direction parallel to the insertion direction D (refer to FIG. 3) of the substrate 120, and an arc portion protrudes laterally. Therefore, in the protrusion 158, the width dimension in the lower end is larger. The press-fit margin portion 166 is disposed so that a distance from the upper end 166a to the substrate receiving portion 160 is smaller than a thickness of the substrate 120.

As shown in FIG. 6B, if the substrate 120 is inserted in to the main body portion 142, the protrusion 158 enters the protrusion receiving portion 128 of the substrate 120. At this time, the press-fit margin portion 166 of the protrusion 158 is press-fitted to the protrusion receiving portion 128. The press-fit margin portion 166 is integrally formed with the protrusion 158 by a resin material or the like which is softer than the substrate 120. Thereby, if the substrate 120 is inserted to the main body portion 142, a corner 138 of the substrate 120, which is formed by the side surface of the protrusion receiving portion 128 and the second main surface 121b, is embedded to the surface of the press-fit margin portion 166. The press-fit margin portion 166 is pressed to the corner 138 and is deformed, or the surface of the margin portion is shaved off by the corner 138. The press-fit margin portion 166 is press-fitted to the protrusion receiving portion 128, and thus, the positioning of the substrate 120 relative to the case 140 in the first direction is accomplished.

Similar to Embodiment 1, in the structure in which the protrusion 158 does not include the press-fit margin portion 166, the width dimensions of the protrusion 158 and the protrusion receiving portion 128 are adjusted so that the protrusion 158 is press-fitted to the protrusion receiving portion 128, the protrusion 158 is press-fitted to the protrusion receiving portion 128, and thus, the substrate 120 are positioned relative to the case 140. However, in this case, significantly high dimension accuracy is required in the protrusion receiving portion 128 and the protrusion 158. On the other hand, in the present embodiment, the protrusion 158 includes the press-fit margin portion 166, which protrudes the width direction of the protrusion receiving portion 128, in the lower end of the protrusion. Moreover, the corner 138 of the substrate 120 is fitted to the press-fit margin portion 166. That is, in the fitting structure of the substrate 120 and the case 140, the corner 138 from the side surface of the protrusion receiving portion 128 serves as the fitting portion of the substrate 120 side. Moreover, the press-fit margin portion 166 from the side surface of the protrusion 158 serves as the fitting portion of the case 140 side.

Therefore, according to the first positioning mechanism of the present embodiment, even when deviation (error) in the dimension relationship of the protrusion receiving portion 128 and the protrusion 158 occurs due to dimension tolerances of the appearances of the substrate 120 and the case 140 or dimension tolerances of the protrusion receiving portion 128 and the protrusion 158, an embedding amount of the corner 138 to the press-fit margin portion 166 is changed according to the deviation, and the press-fitting of the protrusion 158 to the protrusion receiving portion 128 can be secured. That is, the above-described deviation of the dimension relationship can be absorbed by the increase and decrease of the embedding amount of the corner 138 to the press-fit margin portion 166. Thereby, the dimension accuracy required in the protrusion receiving portion 128 and the protrusion 158 can be relieved. Moreover, the shape of the press-fit margin portion 166 may be a triangular shape in which the width of the press-fit margin portion is gradually widened toward the lower end of the protrusion 158 when the press-fit margin portion is viewed from a direction parallel to the insertion direction D.

Moreover, in the present embodiment, in the grooves which configure the protrusion receiving portion 128, the press-fit margin portion 166 of the protrusion 158 is press-fitted to the area (the area from the center portion in the thickness direction of the substrate 120 to the second main surface 121b) near the second main surface 121b opposite to the first main surface 121a on which the inclination sensor 110 is mounted. Therefore, distortion of the first main surface 121a side of the substrate 120 which is generated by the press-fitting of the protrusion 158 can be decreased, and stress, which is applied to the inclination sensor 110 or the like due to the distortion of the substrate 120, can be decreased. Moreover, compared to the structure in which the side surface of the protrusion 158 and the side surface of the protrusion receiving portion 128 are pressed to each other, since the present embodiment has the structure in which the corner 138 of the substrate 120 and the press-fit margin portion 166 are fitted to each other, a deformed portion of the protrusion 158 can be decreased. Thereby, stress itself which is applied to the substrate 120 can be decreased, and the distortion of the substrate 120 can be decreased. As a result, since elements such as the inclination sensor 110 can be securely connected by the substrate 120, a decrease in accuracy of the auto-leveling control can be suppressed.

Moreover, similar to Embodiment 1, the protrusion 164 of the cover portion 144 is inserted into the protrusion receiving portion 132 which is provided on the second side surface 130 of the substrate 120, and thus, the positioning of the substrate 120 relative to the case 140 in the first direction is accomplished. In addition, the first main surface 121a of the substrate 120 abuts the substrate receiving portion 160, the corner 138 is embedded to the press-fit margin portion 166, and thus, the second main surface 121b of the substrate 120 abuts the press-fit margin portion 166. That is, the substrate 120 (protrusion) is press-fitted to the groove (protrusion receiving portion) which is formed by the substrate receiving portion 160 and the protrusion 158. Thereby, the positioning in the second direction of the substrate 120 relative to the case 140 is accomplished. Therefore, the press-fit margin portion 166 of the protrusion 158 configures a portion of the first positioning mechanism and a portion of the second positioning mechanism.

Moreover, in the present embodiment, the groove extends over the entire area from the first main surface 121*a* side of the first side surface 126 to the second surface 121*b* side. However, a structure may be used in which the groove is provided on only the area near the second main surface 121*b* and the protrusion 158 is press-fitted to the groove provided on the area near the second main surface 121*b*.

(Embodiment 3)

The inclination sensor device 102 according to Embodiment 3 is the same as that of Embodiment 1 except that the first positioning mechanism and the second positioning mechanism are different from those of Embodiment 1. Hereinafter, with respect to the inclination sensor device 102 according to Embodiment 3, configurations different from those of Embodiment 1 will be mainly described.

Figure 7A:
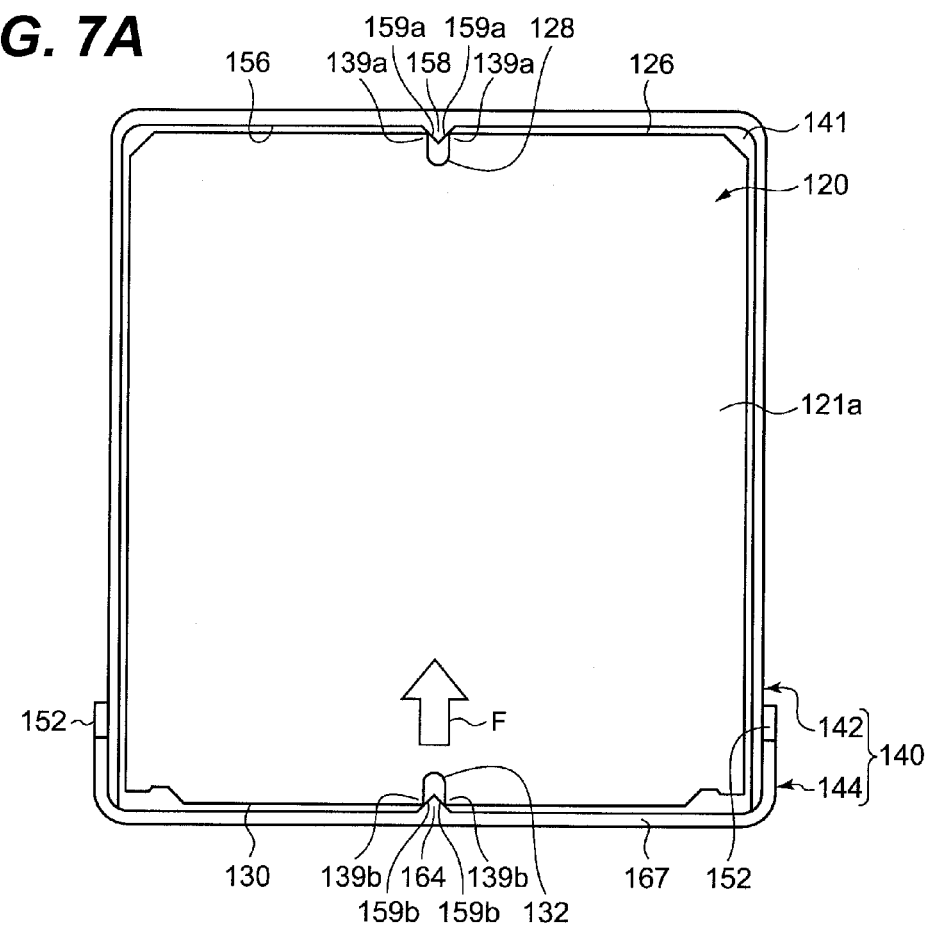
FIG. 7A is a perspective plan view showing a schematic structure of an inner portion of an inclination sensor device according to Embodiment 3.
Figure 7B:
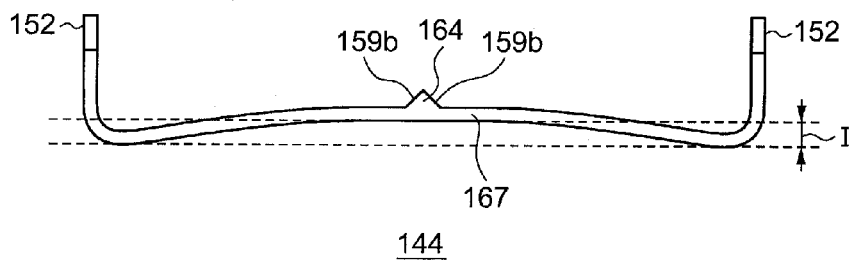
FIG. 7B is a schematic view of a cover portion of the inclination sensor device according to Embodiment 3.

FIG. 7A is a plan perspective view showing a schematic structure of an inner portion of the inclination sensor device according to Embodiment 3. FIG. 7B is a schematic view of a cover portion of the inclination sensor device according to Embodiment 3. In addition, illustrations of the inclination sensor 110, the CPU 122, the connector 124, or the like mounted on the substrate 120 are omitted in FIG. 7A. As shown in FIG. 7A, the case 140 includes an approximately triangular protrusion 158 on the first inner wall 156 of the main body portion 142 when viewed from the direction approximately perpendicular to the main surface of the case 140. The protrusion 158 is disposed so that one of vertexes of the triangle protrudes the cover portion 144 side. If the substrate 120 is inserted into the main body portion 142, two corners 139*a*, which are formed by the side surface of the protrusion receiving portion 128 and the first side surface 126 of the substrate 120, abut two tapered surfaces 159*a* corresponding to sides of the triangle of the protrusion 158.

In addition, the case 140 includes an approximately triangular protrusion 164 on the surface facing the accommodation space 141 side of the cover portion 144 when viewed from the direction approximately perpendicular to the main surface of the case 140. The protrusion 164 is disposed so that one of vertexes of the triangle protrudes the first side surface 126 side. If the cover portion 144 is fitted into the main body portion 142, two corners 139*b*, which are formed by the side surface of the protrusion receiving portion 132 and the second side surface 130 of the substrate 120, abut two tapered surfaces 159*b* corresponding to sides of the triangle of the protrusion 164. Here, the cover portion 144 can be elastically deformed, and for example, as shown in FIG. 7B, in a state before the cover portion is fitted to the main body portion 142, the cover portion has a curved shape in which a wall portion 167 including the protrusion 164 protrudes in the protrusion direction of the hook 152. In addition, if the cover portion 144 is fitted to the main body portion 142, the wall portion 167 is elastically deformed to an approximately flat shape (refer to FIG. 7A).

That is, in the state where the cover portion 144 is fitted to the main body portion 142, a biasing force F can be generated by the elastic deformation of the wall portion 167, and thus, the substrate 120 can be biased toward the first inner wall 156 of the main body portion 142. In the present embodiment, by the biasing of the substrate 120 due to the wall portion 167 of the cover portion 144, the positioning of the substrate 120 relative to the case 140 in the first direction is accomplished. In this case, since the appearance dimension of the substrate 120 or the deviation (error) in the dimensions of the protrusion receiving portions 128 and 132, and the appearance dimension of the case 140 or the deviation in the dimensions of the protrusions 158 and 164 can be absorbed by using the elasticity of the cover portion 144, the substrate 120 can be fixed to the case 140 with zero play. Moreover, in the structure in which the protrusion is press-fitted to the protrusion receiving portion, significantly high dimension accuracy is required in the protrusion and the protrusion receiving portion. However, according to the structure which positions the substrate 120 and the main body portion 142 by biasing the substrate 120 to the main body portion 142 through elasticity of the cover portion 144, the dimension accuracy required in the protrusion and the protrusion receiving portion can be relieved.

Moreover, in the present embodiment, the corner 139*a* of the substrate 120 abuts the tapered surface 159*a* of the protrusion 158. In addition, the corner 139*b* of the substrate 120 abuts the tapered surface 159*b* of the protrusion 164. Thereby, the above-described deviation of the dimension can be converted to the deviation of the position in the insertion direction D of the substrate 120. On the other hand, in the present embodiment, the substrate 120 is biased to the main body portion 142 due to elastic deformation in the insertion direction D of the cover portion 144. Therefore, since an elastic deformation amount of the cover portion 144 can be changed according to the deviation of the position of the substrate 120, the deviation of the position of the substrate 120 can be absorbed. Thereby, the positioning of the substrate 120 relative to the case 140 can be achieved with high accuracy.

It is preferable that a protruding amount I (refer to FIG. 7B) of the wall portion 167 to the main body portion 142 side be determined so that the wall portion 167 is flat in the state where the cover portion 144 is fitted to the main body portion 142. Therefore, in a completion state of the inclination sensor device 102, it is possible to make the deformation of the cover portion 144 unnoticeable. For example, the protruding amount I of the wall portion 167 can be set based on a total value of the dimension tolerance of the appearance of the substrate 120 or the case 140, the dimension tolerance of the protrusion receiving portions 128 and 132 and the protrusions 158 and 164, or the like. For example, the protruding amount I is set so that the wall portion 167 is flat when the total value of the dimension tolerance is minimum.

For example, similar to Embodiment 1, the second positioning mechanism of the inclination sensor device 102 according to the present embodiment can be realized by the substrate guide 146, the substrate receiving portions 160 and 162, and the first main surface 121*a* and the second main surface 121*b* of the substrate 120. Alternatively, the second positioning mechanism may be a structure in which the substrate 120 is biased to the inner wall of the main body portion 142 by elasticity of the cover portion 144. In addition, in the present embodiment, the protrusions 158 and 164 are provided in the case 140, and the protrusion receiving portions 128 and 132 are provided in the substrate 120. However, the protrusions may be provided in the substrate 120, and the protrusion receiving portion may be provided in the case 140.

A vehicle lamp system according to an embodiment is configured of the inclination sensor device 102 according to each embodiment described above, a lamp unit 10 which is a vehicle lamp capable of adjusting the optical axis O, and the CPU 122 which is a control device. In the present embodiment, the CPU 122 is mounted on the substrate 120. However, the CPU 122 may be provided at other locations.

The present invention is not limited to each embodiment described above, the embodiments can be combined respectively, modifications such as various design modifications can be applied based on knowledge of a person skilled in the art, and the combined embodiments or the modified embodiments are also included in the scope of the present invention. The above-described embodiments and new embodiments generated by combining the embodiments and modifications have effects of each of the combined embodiments and modifications.

In each embodiment described above, the positions or the number of installations of the protrusions and the protrusion receiving portions can be appropriately set. Moreover, in each embodiment described above, the acceleration sensor is used as the inclination sensor 110. However, the inclination sensor 110 may be a gyro sensor (angular velocity sensor or angular acceleration sensor), a magnetic field sensor, or the like.

What is claimed is:

1. An inclination sensor device comprising:
   a substrate which mounts an inclination sensor configured to calculate an inclination angle of a vehicle;
   a case which accommodates the substrate;
   a first positioning mechanism which positions the substrate relative to the case in a first direction that is substantially parallel to a first main surface of the substrate; and
   a second positioning mechanism which positions the substrate relative to the case in a second direction that is substantially perpendicular to the first main surface of the substrate;
   wherein at least one of the first positioning mechanism and the second positioning mechanism comprises:
   a protrusion provided on one of the substrate and the case, the protrusion extending in the first direction; and
   a protrusion receiving portion provided in the other of the substrate and the case, and
   wherein the substrate is positioned relative to the case by press-fitting the protrusion to the protrusion receiving portion.

2. The inclination sensor device according to claim 1, wherein the case comprises:
   a main body portion having a first inner wall and an opening opposite to the first inner wall; and
   a cover portion which covers the opening to face the first inner wall, wherein the cover portion is configured to press against the substrate toward the first inner wall, and
   wherein when the cover portion presses against the substrate toward the first inner wall, the substrate is positioned relative to the case in at least one of the first direction and the second direction.

3. A vehicle lamp system comprising:
   a vehicle lamp configured to adjust an optical axis;
   an inclination sensor device according to claim 1, wherein an inclination sensor is mounted in the inclination sensor device; and
   a control device configured to generate a vehicle inclination angle information based on an output value of the inclination sensor and to control the vehicle lamp to adjust the optical axis of the vehicle lamp based on the vehicle inclination angle information.

4. The inclination sensor device according to claim 1, wherein the substrate comprises:
   the first main surface on which the inclination sensor is mounted;
   a second main surface opposite to the first main surface; and
   a side surface between the first main surface and the second main surface,
   wherein the protrusion receiving portion is provided in the substrate and comprises a groove which is formed in the side surface of the substrate and closer to the second main surface than the first main surface, and
   wherein the protrusion provided on the case is press-fitted to the groove.

5. The inclination sensor device according to claim 1,
   wherein the case comprises:
   a main body portion having a first inner wall and an opening opposite to the first inner wall; and
   a cover portion which covers the opening to face the first inner wall,
   wherein
   the substrate comprises:
   the first main surface of the substrate on which the inclination sensor is mounted;
   a second main surface opposite to the first main surface; and
   a first side surface between the first main surface and the second main surface and facing the first inner wall,
   wherein
   the protrusion is provided on one of the first inner wall and the first side surface, and
   the protrusion receiving portion is provided in the other of the first inner wall and the first side surface, and
   wherein
   an insertion direction of the substrate to the main body portion is the same as a press-fitting direction of the protrusion to the protrusion receiving portion, and
   while the substrate is inserted into the main body portion, the protrusion is press-fitted to the protrusion receiving portion.

6. The inclination sensor device according to claim 5,
   wherein the substrate further comprises:
   a second side surface opposite to the first side surface and facing the cover portion, and
   wherein
   in addition to the protrusion, another protrusion is provided on one of the cover portion and the second side surface, and
   in addition to the protrusion receiving portion, another protrusion receiving portion is provided in the other of the cover portion and the second side surface.

7. An inclination sensor device comprising:
   a substrate which mounts an inclination sensor configured to calculate an inclination angle of a vehicle;
   a case which accommodates the substrate;
   a first positioning mechanism which positions the substrate relative to the case in a first direction that is substantially parallel to a first main surface of the substrate; and
   a second positioning mechanism which positions the substrate relative to the case in a second direction that is substantially perpendicular to the first main surface of the substrate;
   wherein at least one of the first positioning mechanism and the second positioning mechanism comprises:
   a protrusion provided on one of the substrate and the case; and
   a protrusion receiving portion provided in the other of the substrate and the case, and
   wherein the substrate is positioned relative to the case by press-fitting the protrusion to the protrusion receiving portion;

wherein the substrate comprises:
the first main surface on which the inclination sensor is mounted;
a second main surface opposite to the first main surface; and
a side surface between the first main surface and the second main surface,
wherein the protrusion receiving portion is provided in the substrate and comprises a groove which is formed in the side surface of the substrate and closer to the second main surface than the first main surface, and
wherein the protrusion provided on the case is press-fitted to the groove.

8. An inclination sensor device comprising:
a substrate which mounts an inclination sensor configured to calculate an inclination angle of a vehicle;
a case which accommodates the substrate;
a first positioning mechanism which positions the substrate relative to the case in a first direction that is substantially parallel to a first main surface of the substrate; and
a second positioning mechanism which positions the substrate relative to the case in a second direction that is substantially perpendicular to the first main surface of the substrate;
wherein at least one of the first positioning mechanism and the second positioning mechanism comprises:
a protrusion provided on one of the substrate and the case; and
a protrusion receiving portion provided in the other of the substrate and the case, and
wherein the substrate is positioned relative to the case by press-fitting the protrusion to the protrusion receiving portion;
wherein the case comprises:
a main body portion having a first inner wall and an opening opposite to the first inner wall; and
a cover portion which covers the opening to face the first inner wall,
wherein
the substrate comprises:
the first main surface of the substrate on which the inclination sensor is mounted;
a second main surface opposite to the first main surface; and
a first side surface between the first main surface and the second main surface and facing the first inner wall,
wherein
the protrusion is provided on one of the first inner wall and the first side surface, and
the protrusion receiving portion is provided in the other of the first inner wall and the first side surface, and
wherein
an insertion direction of the substrate to the main body portion is the same as a press-fitting direction of the protrusion to the protrusion receiving portion, and
while the substrate is inserted into the main body portion, the protrusion is press-fitted to the protrusion receiving portion.

9. The inclination sensor device according to claim 8,
wherein the substrate further comprises:
a second side surface opposite to the first side surface and facing the cover portion, and
wherein
in addition to the protrusion, another protrusion is provided on one of the cover portion and the second side surface, and
in addition to the protrusion receiving portion, another protrusion receiving portion is provided in the other of the cover portion and the second side surface.

\* \* \* \* \*